(12) United States Patent
Lazovski et al.

(10) Patent No.: US 9,596,742 B2
(45) Date of Patent: Mar. 14, 2017

(54) DEVICE FOR A CONTROLLED ELECTROSTATIC DISCHARGE IN PERSONS

(71) Applicants: Tase Lazovski, Nova Gorica (SI); Emil Benko, Nova Gorica (SI); Angelo Porcaro, Dott. Cav., Udine (IT)

(72) Inventors: Tase Lazovski, Nova Gorica (SI); Emil Benko, Nova Gorica (SI); Angelo Porcaro, Dott. Cav., Udine (IT)

( * ) Notice: Subject to any disclaimer, the term of this patent is extended or adjusted under 35 U.S.C. 154(b) by 309 days.

(21) Appl. No.: 14/373,004

(22) PCT Filed: Jan. 17, 2013

(86) PCT No.: PCT/SI2013/000002
§ 371 (c)(1),
(2) Date: Jul. 17, 2014

(87) PCT Pub. No.: WO2013/109196
PCT Pub. Date: Jul. 25, 2013

(65) Prior Publication Data
US 2015/0070811 A1 Mar. 12, 2015

(30) Foreign Application Priority Data
Jan. 19, 2012 (SI) .................................. 201200015

(51) Int. Cl.
*H05F 3/04* (2006.01)
*H05K 9/00* (2006.01)
(52) U.S. Cl.
CPC ............. *H05F 3/04* (2013.01); *H05K 9/0067* (2013.01)

(58) Field of Classification Search
CPC ................................ H05K 9/0067; H05F 3/04
USPC .......................................................... 361/220
See application file for complete search history.

(56) References Cited

U.S. PATENT DOCUMENTS 3,935,508 A * 1/1976 Moister, Jr. .............. H05F 3/04
218/143
4,513,347 A * 4/1985 Wilcox ..................... H05F 3/02
361/212

FOREIGN PATENT DOCUMENTS

JP 02-288200 A 11/1990

OTHER PUBLICATIONS

International Search Report; PCT/SI2013/000002; Sep. 20, 2013.

* cited by examiner

*Primary Examiner* — Thienvu Tran
*Assistant Examiner* — Kevin J Comber
(74) *Attorney, Agent, or Firm* — Studebaker & Brackett PC

(57) ABSTRACT

A device for a controlled electrostatic discharge in persons consists of two electrically non-conductive elements mutually spaced by at least one spring and arranged in a housing. At least one element is arranged in the housing in a way to come closer parallel to a second element when force is exerted on it from the outside. Electric pins are arranged on adjacent surfaces of both elements and arranged on each surface at a mutual distance and the two surfaces are arranged at a mutual distance and simultaneously the rows of pins on one and the second element are offset, so that the pins of one row lie in the middle of the distance and both rows of pins are spaced from each other by a different distance.

11 Claims, 1 Drawing Sheet

DEVICE FOR A CONTROLLED ELECTROSTATIC DISCHARGE IN PERSONS

SUBJECT OF THE INVENTION

Figure 1:
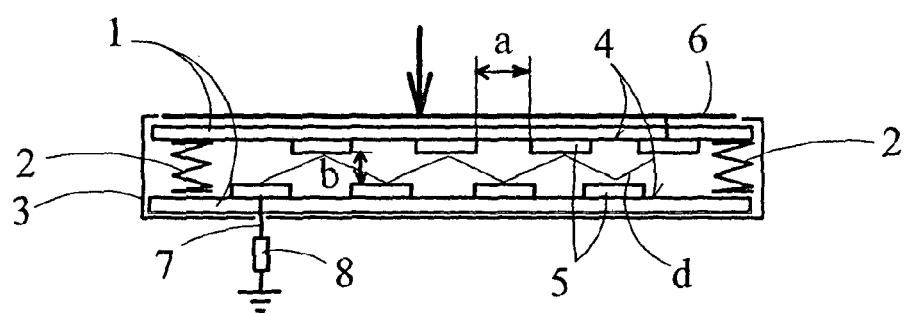

The subject of the present invention is a device for a controlled electrostatic discharge in persons mostly where persons do not expect discharge to appear or where discharge may be expected to be disturbing for people. The device can prove useful both in public facilities, in which flooring made of artificial fibres, and various objects like staircase fences can be expected to cause static electricity in persons, as well as in private places when various domestic appliances are touched, and also in vehicles. The device of the invention is preferably intended to be used on gambling machines in casinos, which is the case of use in public facilities, then in vehicles, when movable machines outdoors are in question. The device can be very suitably used on touch screens, in which protection of such a screen is in question.

TECHNICAL PROBLEM

The technical problem solved by the present invention is a design of a device that can be installed as an upgrade, wherein the installation should not damage contact surfaces of the object, on which the device of the invention is arranged. Further, the device should not be disturbing for the persons at their work in terms of application and design; the device of the invention should allow to be used as a material, from which objects having a different basic purpose can be manufactured, such as a knob, a handle, wherein such an object will also function as a discharge element. Moreover, the device should allow several different variants in terms of industrial design in order to adapt the shape of the object to the design concept of the environment.

Despite several ways of electrical grounding of devices, and also floors are often provided with an electrostatic discharge grid, it happens that persons present in rooms full of artificial substances get charged with static electricity and discharging occurs when a charge passes to a grounded object. So there is a need for an additional device that would carry out the electrostatic discharge more slowly, so that it no longer causes discomfort. In touch screens for instance a person charged with static electricity can cause damage or complete breakdown of the touch screen.

PRIOR ART

Principally, the use of a spark gap is in question. In a spark gap a circuit that grounds a device, in which a discharge of a person can be expected, is interrupted by an air gap, whose length depends on the size of an expected charge. In the above-described circumstances people get charged with a charge of 10-25 kV. Having in mind that the breakdown strength of air is 3.2 kV, an air gap of approximately 8 mm is needed for the mentioned charge in order to avoid the electric discharge. If a spark gap for this purpose is to be designed, this is the value to be kept in mind, and consequently a huge discharge device needs to be created, what is contrary to the need for a discrete design for the above-mentioned applications.

SOLUTION TO THE TECHNICAL PROBLEM

The described technical problem is solved with a device of the invention designed in three embodiments. The basis of the first embodiment is a spark gap. The first embodiment of the invention is characteristic and new in that an air gap present between the pins of the spark gap is formed in a way that electric pins are arranged on adjacent surfaces of two elements that get closer to each other when touched by a person charged with an electric charge, wherein said electric pins are arranged with a space between them. A first pin arranged on one element and a second pin arranged on another element are connected in series to a discharge circuit. Two rows of electric pins on the first and second surfaces are arranged in an offset manner, so that one pin on one surface is located in the area between two pins arranged on the second surface. An air gap is thus defined as a sum of distances from one pin on the first surface to the closest pin on the second surface and from that pin to the second pin on the first surface and so forth all to the last pin on the second surface. A design of this type respects the prescribed air gap and the height of the device is therefore considerably lower than the prescribed air gap and the approaching of both elements is considerably shorter in order to shorten the air gap to the length, at which a discharge spark of a charge passes with a certain value kV. The second embodiment is characterized by an electrically non-conductive plastic material having a feature of dispersed discharge at high voltages. This feature prevents electric breakdown in one spot. Consequentially, a person does not feel the discharge and multistage discharge takes place. The quantity of electric charge upon each discharge is so small that a person who is getting discharged does not feel it. And this is the goal of the invention.

Figure 2:
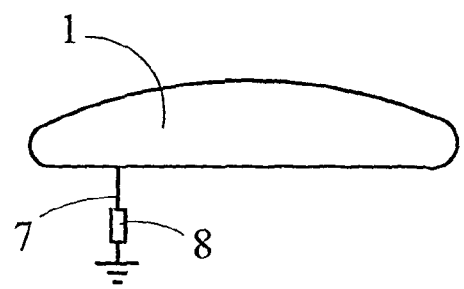

The essence of the invention will be explained in more detail in the continuation by way of an embodiment and the enclosed drawings representing in FIG. 1 cross-section of the device of the invention; and
FIG. 2 second embodiment in side view.

FIRST EMBODIMENT

A device for a controlled electrostatic discharge in persons consists of two electrically non-conductive elements 1 mutually spaced by means of at least one spring 2. The elements 1 are arranged in a housing 3 designed in any manner in regard to a place where the device is installed or built in. The housing 3 can be a constituent part of any part of the device, such as a gambling apparatus, at a place where a person will most certainly touch the device due to the way an apparatus is used. Such parts of devices are preferably operating or control elements, like joysticks or switches. These parts are not shown in figures.

The housing 3 is designed to receive one element 1 in a way that when a force is applied from the outside it moves closer parallel to the second element 1 and returns to the initial position by way of said spring 2 after the force from the outside has been neutralized.

The external surface of the element 1 accessible to a person intended to get discharged is provided with an electrically conductive part 6, preferably a metallic plate.

Electric pins 5 are arranged on adjacent surfaces 4 of both elements 1. The pins 5 are arranged on each surface 4 at a mutual distance a. The two surfaces 4 are arranged at a mutual distance b. The rows of pins 5 on one and the second element 1 are offset, so that the pins 5 of one row lie in the middle of the distance a and both rows of pins 5 are spaced from each other by a distance b. The first pin 5 in the row on one element 1 and the last pin 5 in the row on the second element 1 are connected in series to a discharge electric circuit comprising a section 6, pins 5 and a grounding conductor 7. An air gap c defining the breakdown strength of the air is a sum of diagonal distances d between the closest pins 5 of the first and the second rows of pins 5. In order to reduce the air gap c and to reach breakdown and discharge, the elements 1 need to be moved in parallel to each other for a distance that is equal to or smaller than the distance a. The task of the invention is herewith solved.

The spring 2 holding both elements 1 at a mutual distance is reasonably designed in a way that at least one element is made of an elastic material and leans against the second element 1 in order to form said air gap or the distance b between the rows of pins 5. When force is exerted on one element 1, the elastic element 1 gets deformed and the distances between the rows of pins 5 are reduced as described above.

The element 1 which is not intended to be touched by a user is grounded with a conducting element 7, wherein a resistor 8 is connected in series to this conducting element 7. When a person gets discharged, the electric property of the resistor causes several sequential discharge breakdowns, of which each is so weak that the person getting discharged does not feel it. The preferred material having the described properties is polyvinyl chloride with an addition of 2-ethylhexyl.

The described device can easily be installed into switches on apparatuses, on joysticks etc. The device can of course be a standalone unit as well. The device of the invention must be arranged at a spot that will most likely be first touched by a user when using this apparatus.

The device of the invention can be used on any machines accessible by any persons and in which electrostatic charge often appears in persons. A need for such a device is obvious in casinos due to a huge quantity of plastic materials (floor, etc.). This problem is further present in vehicles.

Second Embodiment

The second embodiment has the same functional properties as the first embodiment but it is characterized in that it is designed from a flexible material that can be formed by moulding and spraying. Its electric property causes several consecutive discharges in a person to be discharged and the discharges are so weak that they are not felt by that person. The device of this embodiment can be produced by moulding processes, and this offers designers a free choice of selection. It is suitable as a cladding of door handles in vehicles, of various operating handles and various, especially uneven surfaces that will obviously be touched by persons, on whom discharges may be expected. Like in the first embodiment earthing is needed for a proper operation.

The device of this embodiment can be designed as a stand-alone object to be arranged on a desired spot, where a person desires to get discharged. The device is designed as a panel that makes discharge possible and has an edge made of an electrically insulating material that protects a person to be discharged from touching the surface by mistake if he/she misses to exactly touch the discharge panel; this would cause an uncomfortable immediate discharge.

The device of the second embodiment is made as an element of an optional shape depending on the purpose of the object and is made of the above-mentioned material. Earthing is carried out by means of a conducting element.

A material having the described properties that can be used is a polymeric composite with additives for surface tension regulation. Such material is for instance polyvinyl chloride with an addition of 2-ethylhexyl.

Electric resistance of the above-mentioned material ranges from $4 \times 10^8$ to $4 \times 10^{13} \Omega$.

Third Embodiment

The invention in the third embodiment is intended for cases, in which it is desired to produce various products that preserve their purpose and simultaneously also function as a discharge element.

A polymeric composite with additives for regulation of volumetric conductivity is used for this purpose. Said additive can be graphite and the electric resistance of the above material should be in the range from $4 \times 10^8$ to $4 \times 10^{13} \Omega$.

Such material is suitable for the production of objects by spraying processes.

If there is not enough space for an arrangement of a panel made of the material of the invention at a spot intended for discharge, it is possible to arrange only an electrically conductive film on the discharge spot, and the conductive film is connected via a conductor with the material of the invention. The conductor is arranged in the vicinity of the spot intended for discharge and electrically grounded.

If a person is anticipated to get discharged at several spots in the area, the discharge device of the invention intended to be arranged at a spot meant for a discharge of a person can be embedded in a thimble or a ring made of the material of the invention.

It is understood that by knowing the above description of the invention and its embodiments a person skilled in the art can design new embodiments especially in the sense of industrial design and based on special needs without circumventing the characteristics of the invention as claimed in the appended claims.

The invention claimed is:

1. A device for a controlled electrostatic discharge in persons, said device comprising
two electrically non-conductive elements mutually spaced by at least one spring and arranged in a housing, wherein at least one element is arranged in the housing in a way to come closer parallel to a second element when force is exerted on it from outside and to return to an initial position by said at least one spring after the force from the outside has been neutralized, an external surface of the at least one element accessible to a person being discharged is provided with an electrically conductive part, and electric pins are arranged on adjacent surfaces of both the at least one and the second elements and arranged on each adjacent surface at a first mutual distance and the adjacent surfaces are arranged at a second mutual distance and simultaneously rows of pins on the at least one element and the second element are offset, so that the electric pins of one row lie in a middle of the first mutual distance and both rows of electric pins are spaced from each other by the second mutual distance, wherein a first pin in the row of pins on the at least one element and a last pin in the row of electric pins on the second element are connected in series to a discharge electric circuit having a section on the at least one element, electric pins and a grounding conductor.

2. Device according to claim 1, wherein an air gap defining a breakdown strength of air is a sum of diagonal distances between the electric pins closest to each other of a first and a second row of electric pins.

3. Device according to claim 1, wherein the at least one spring is designed in a way that at least one element is made of an elastic material and leans against the second element in order to form an air gap or the second mutual distance between the rows of electric pins, and when force is exerted on at least one element, the elastic element gets deformed and the distance between the rows of electric pins is reduced.

4. Device according to claim 1, wherein the second element is grounded with a conducting element, wherein a resistor is connected in series to the conducting element, an electric property of said resistor causing several sequential discharge breakdowns, of which each is so weak that the person being discharged does not feel it, and a material having the electric property is polyvinyl chloride with an addition of ethylhexyl.

5. Device according to claim 1, wherein the device is designed from a material formed by moulding and spraying, wherein the material is selected in a way that its electric resistance ranges from $4\times10^8$ to $4\times10^{13}\Omega$.

6. Device according to claim 5, wherein a polymeric composite with additives for regulation of superficial voltage is used.

7. Device according to claim 5, wherein polyvinyl chloride with an addition of 2-ethylhexyl is used as the material.

8. Device according to claim 5, wherein a polymeric composite with additives for regulation of volumetric conductivity is used as the material.

9. Device according to claim 5, wherein graphite is used as an additive.

10. Device according to claim 5, further comprising an electrically conductive film arranged at a spot anticipated for discharge and which is connected via a conductor with the material and arranged in a vicinity of the spot anticipated for discharge and electrically grounded.

11. Device according to claim 5, wherein the device is designed in the form of a thimble or a ring made of the material.

* * * * *